US006437642B1

(12) United States Patent
Rozario

(10) Patent No.: US 6,437,642 B1
(45) Date of Patent: Aug. 20, 2002

(54) MULTIPORT AMPLIFIER WITH A NUMBER OF AMPLIFIER ELEMENTS OTHER THAN 2

(75) Inventor: Novellone Rozario, Yardville, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/528,625

(22) Filed: Mar. 20, 2000

(51) Int. Cl.[7] ................................................. H03F 3/68
(52) U.S. Cl. ........................ 330/53; 330/124 R; 330/295
(58) Field of Search ............................... 330/53, 124 R, 330/286, 295

(56) References Cited

U.S. PATENT DOCUMENTS 4,618,831 A * 10/1986 Egami et al. ............ 330/124 R
4,644,301 A * 2/1987 Hecht ........................ 333/101
5,917,371 A * 6/1999 Chesarek et al. ........ 330/124 R

* cited by examiner

Primary Examiner—Tuan T. Lam
(74) Attorney, Agent, or Firm—Duane Morris LLP

(57) ABSTRACT

An array of a plurality of amplifiers, where the plurality is a number other than $2^N$, where N is an integer, is paralleled by the use of an array of hybrids coupled to the input and output ports of the amplifiers. The paralleling is such that the input signals applied to any one of the input ports of the paralleled combination passes through the same number of paralleled amplifiers as the input signals applied to any other input port. In particular examples having ten and twelve paralleled amplifiers, the signals applied to any input port are divided so as to pass through eight of the ten or twelve amplifiers. This improves the redundancy and the EIRP flexibility.

5 Claims, 13 Drawing Sheets

Table for M = 10. Hence M/2 = 5, M' = 8, $\log_2 M' = 3$. Hence i varies from 1 to 5, j varies between 1 and 2, and k varies from 1 to 3. When the equation $$O_{k-1}[int((i-1 + (j-1)M/2)/2)+1, \; mod((i-1+(j-1)M/2),2)+1]$$

is translated for these values of i and j, we get the following table.

| A | B | C | D | E | F | G | H |
|---|---|---|---|---|---|---|---|
| Indices for input port of the hybrid column k ($I_k$) | | Computation of indices for output port of the hybrid column k-1 ($O_{k-1}$) | | | Construction of the expressions | | |
| i | j | (i-1+(j-1)M/2)/2 | int((i-1+(j-1)M/2)/2)+1 | mod((i-1+(j-1)M/2),2)+1 | $I_k[i,j]$ | $O_{k-1}[int((i-1 + (j-1)M/2)/2)+1, mod((i-1+(j-1)M/2),2)+1]$ | In other words, |
| Hybrid #1 Port #1 | | 1 | Hybrid #1 | Port #1 | $I_k[1,1]$ | $O_{k-1}[1, 1]$ | The k-th column's hybrid #1's <u>input port #1</u> is connected to the (k-1)-th column's hybrid #1's <u>output port #1</u> |
| Hybrid #1 Port #2 | | 3.5 | Hybrid #3 | Port #2 | $I_k[1,2]$ | $O_{k-1}[3, 2]$ | The k-th column's hybrid #1's <u>input port #2</u> is connected to the (k-1)-th column's hybrid #3's <u>output port #2</u> |
| Hybrid #2 Port #1 | | 1.5 | Hybrid #1 | Port #2 | $I_k[2,1]$ | $O_{k-1}[1, 2]$ | The k-th column's hybrid #2's <u>input port #1</u> is connected to the (k-1)-th column's hybrid #1's <u>output port #2</u> |
| Hybrid #2 Port #2 | | 4 | Hybrid #4 | Port #1 | $I_k[2,2]$ | $O_{k-1}[4, 1]$ | The k-th column's hybrid #2's <u>input port #2</u> is connected to the (k-1)-th column's hybrid #4's <u>output port #1</u> |
| Hybrid #3 Port #1 | | 2 | Hybrid #2 | Port #1 | $I_k[3,1]$ | $O_{k-1}[2, 1]$ | The k-th column's hybrid #3's <u>input port #1</u> is connected to the (k-1)-th column's hybrid #2's <u>output port #1</u> |
| Hybrid #3 Port #2 | | 4.5 | Hybrid #4 | Port #2 | $I_k[3,2]$ | $O_{k-1}[4, 2]$ | The k-th column's hybrid #3's <u>input port #2</u> is connected to the (k-1)-th column's hybrid #4's <u>output port #2</u> |
| Hybrid #4 Port #1 | | 2.5 | Hybrid #2 | Port #2 | $I_k[4,1]$ | $O_{k-1}[2, 2]$ | The k-th column's hybrid #4's <u>input port #1</u> is connected to the (k-1)-th column's hybrid #2's <u>output port #2</u> |
| Hybrid #4 Port #2 | | 5 | Hybrid #5 | Port #1 | $I_k[4,2]$ | $O_{k-1}[5, 1]$ | The k-th column's hybrid #4's <u>input port #2</u> is connected to the (k-1)-th column's hybrid #5's <u>output port #1</u> |
| Hybrid #5 Port #1 | | 3 | Hybrid #3 | Port #1 | $I_k[5,1]$ | $O_{k-1}[3, 1]$ | The k-th column's hybrid #5's <u>input port #1</u> is connected to the (k-1)-th column's hybrid #3's <u>output port #1</u> |
| Hybrid #5 Port #2 | | 5.5 | Hybrid #5 | Port #2 | $I_k[5,2]$ | $O_{k-1}[5, 2]$ | The k-th column's hybrid #5's <u>input port #2</u> is connected to the (k-1)-th column's hybrid #5's <u>output port #2</u> |

*Fig. 7a*

Table for M=12. Hence M/2 = 6, M' = 8, log₂M' = 3. Hence i varies from 1 to 6, j varies between 1 and 2, and k varies from 1 to 3.

| A | B | C | D | E | F | G | H |
|---|---|---|---|---|---|---|---|
| Indices for input port of the hybrid column k ($I_k$) | | Computation of indices for output port of the hybrid column k-1 ($O_{k-1}$) | | | Construction of the expressions | | |
| i | j | $(i-1+(j-1)M/2)/2$ | $int((i-1+(j-1)M/2)/2)+1$ | $mod((i-1+(j-1)M/2),2)+1$ | $I_k[i,j]$ | $O_{k-1}[int((i-1+(j-1)M/2)/2)+1, mod((i-1+(j-1)M/2),2)+1]$ | In other words, |
| Hybrid #1 Port #1 | | 1 | Hybrid #1 | Port #1 | $I_k[1,1]$ | $O_{k-1}[1,1]$ | The k-th column's hybrid #1's input port #1 is connected to the (k-1)-th column's hybrid #1's output port #1 |
| Hybrid #1 Port #2 | | 4 | Hybrid #4 | Port #1 | $I_k[1,2]$ | $O_{k-1}[4,1]$ | The k-th column's hybrid #1's input port #2 is connected to the (k-1)-th column's hybrid #4's output port #1 |
| Hybrid #2 Port #1 | | 1.5 | Hybrid #1 | Port #2 | $I_k[2,1]$ | $O_{k-1}[1,2]$ | The k-th column's hybrid #2's input port #1 is connected to the (k-1)-th column's hybrid #1's output port #2 |
| Hybrid #2 Port #2 | | 4.5 | Hybrid #4 | Port #2 | $I_k[2,2]$ | $O_{k-1}[4,2]$ | The k-th column's hybrid #2's input port #2 is connected to the (k-1)-th column's hybrid #4's output port #2 |
| Hybrid #3 Port #1 | | 2 | Hybrid #2 | Port #1 | $I_k[3,1]$ | $O_{k-1}[2,1]$ | The k-th column's hybrid #3's input port #1 is connected to the (k-1)-th column's hybrid #2's output port #1 |
| Hybrid #3 Port #2 | | 5 | Hybrid #5 | Port #1 | $I_k[3,2]$ | $O_{k-1}[5,1]$ | The k-th column's hybrid #3's input port #2 is connected to the (k-1)-th column's hybrid #5's output port #1 |
| Hybrid #4 Port #1 | | 2.5 | Hybrid #2 | Port #2 | $I_k[4,1]$ | $O_{k-1}[2,2]$ | The k-th column's hybrid #4's input port #1 is connected to the (k-1)-th column's hybrid #2's output port #2 |
| Hybrid #4 Port #2 | | 5.5 | Hybrid #5 | Port #2 | $I_k[4,2]$ | $O_{k-1}[5,2]$ | The k-th column's hybrid #4's input port #2 is connected to the (k-1)-th column's hybrid #5's output port #2 |
| Hybrid #5 Port #1 | | 3 | Hybrid #3 | Port #1 | $I_k[5,1]$ | $O_{k-1}[3,1]$ | The k-th column's hybrid #5's input port #1 is connected to the (k-1)-th column's hybrid #3's output port #1 |
| Hybrid #5 Port #2 | | 6 | Hybrid #6 | Port #1 | $I_k[5,2]$ | $O_{k-1}[6,1]$ | The k-th column's hybrid #5's input port #2 is connected to the (k-1)-th column's hybrid #6's output port #1 |
| Hybrid #6 Port #1 | | 3.5 | Hybrid #3 | Port #2 | $I_k[6,1]$ | $O_{k-1}[3,2]$ | The k-th column's hybrid #5's input port #1 is connected to the (k-1)-th column's hybrid #3's output port #1 |
| Hybrid #6 Port #2 | | 6.5 | Hybrid #6 | Port #2 | $I_k[6,2]$ | $O_{k-1}[6,2]$ | The k-th column's hybrid #5's input port #2 is connected to the (k-1)-th column's hybrid #6's output port #2 |

MULTIPORT AMPLIFIER WITH A NUMBER OF AMPLIFIER ELEMENTS OTHER THAN 2

FIELD OF THE INVENTION

This invention relates to paralleled amplifiers, and more particularly to paralleled amplifiers interconnected by hybrids to provide channelization, where the number of amplifiers in the paralleled arrangement can be other than $2^N$, where N is an integer.

BACKGROUND OF THE INVENTION

Multichannel spacecraft communications systems are now widely used.

Electronic amplifiers are used to boost signal strength at each end of an uplink and downlink. Power amplifiers are used to boost the power of the signal at the spacecraft before retransmission to earth. Amplifiers are basically nonlinear. If a single power amplifier were to be used to boost the signal power for all of a plurality of channels, the signals in the plural channels would become jumbled together, and, in addition to intermodulation problems attributable to the nonlinearity, the additional problem would exist that the signals could not be re-separated into separate channels without the use of frequency-sensitive filters. To avoid the need for large numbers of such filters, and also to reduce the amount of power which must be handled by a single amplifier, a number of amplifiers is used which is at least equal to the number of independent channels being transmitted. Phase-sensitive hybrid combining networks are coupled to the inputs of the amplifiers, and corresponding phase-sensitive separation hybrid networks are coupled to the outputs of the amplifiers to separate the amplified signals into the original channels. At the spacecraft, each separate channel appearing at the output of the phase-sensitive separation network may be designated, for example, for transmission over a separate antenna beam to a different portion of the Earth's surface.

It should be noted that the paralleling of amplifiers as described above is not done for purposes of redundancy or reliability, because, if a signal amplifier among the plurality of paralleled amplifiers fails, the phase-sensitive channelization is not accomplished.

FIG. 1a is a simplified block diagram of a spacecraft communication system 10 using a prior-art paralleled amplifier. In the arrangement of FIG. 1a, communication system 10 includes a spacecraft 12 and first and second ground stations 14 and 16, respectively.

The spacecraft 12 is illustrated as including a receiving antenna 12ar and a transmitting antenna 12at. Receiving antenna 12ar forms two separate receive antenna beams, designated 12rb1 and 12rb2, directed toward ground stations 14 and 16, respectively. The signals from ground station 14 are generated at a beamformer output port 12aro1, and the signals from ground station 16 are generated at a beamformer output port 12aro2. These signals are designated A and B, for ease of notation. Thus, the A signals are transmitted from ground station 14 to receive antenna 12r by way of beam 12rb1, and the B signals are transmitted from ground station 16 by way of beam 12rb2. The A and B signals are amplified in a paralleled amplifier 20 for application to beamformer ports 12ati2 and 12ati1, respectively, of transmitting antenna 12at of spacecraft 12. Paralleled amplifier 20 has first and second input ports 20i1 and 20i2, and first and second output ports 20o1 and 20o2. The A signals applied to input port 12ati2 are transmitted to ground station 16 by way of antenna beam 12atb2, and the B signals applied to input port 12ati1 are transmitted to ground station 14 by way of beam 12tb1. Consequently, in the simple system of FIG. 1a, two separate locations on the Earth can communicate by way of pairs of antenna beams. The A and B signals may be viewed as being channels of information.

It will be clear in the arrangement of FIG. 1a that, if the A and B signals are jumbled together in paralleled amplifier 20, the signals applied from the paralleled amplifier output ports 20o1 and 20o2 to the beamformer input ports of the transmitting antenna 12at will include a mixture of both the A and B signals, and each transmit beam will transmit both A and B signals to both ground stations. This could be overcome by some method of channelization, such as by frequency division filters. However, such filters are heavy, bulky, and expensive, and therefore may not be desired. In amplifier 20 of FIG. 1a, paralleled amplifiers 1 and 2 are connected to receive the A and B signals from antenna ports 12aro1 and 12aro2 at input ports 20i1 and 20i2, respectively. The "paralleled" aspect of the amplifier 20 requires that there be some kind of cross-coupling of the A signals to amplifiers 1 and 2, and of the B signals to amplifiers 1 and 2. Within paralleled amplifier 20, this cross-coupling is provided by hybrids. In amplifier 20, ports 20i1 and 20i2 are coupled to the ports of a three-dB hybrid H1, well known in the art. Such hybrids are represented by crossed transmission lines in the form of the letter X, with the crossing representing the coupling between two transmission lines of the hybrid. As illustrated in FIG. 1a, the ports of hybrid H1 of FIG. 1a are designated $H1_1$, $H1_2$, $H1_3$ and $H1_4$, with ports $H1_1$ and $H1_2$ being equivalent to, or contiguous with, parallel amplifier ports 20i1 and 20i2, respectively. In such three-dB hybrids, a transmission line, illustrated as a line designated T1, couples ports $H1_1$ to port $H1_4$, and another transmission line, illustrated as a line designated T2, couples ports $H1_2$ and $H1_3$. A salient characteristic of such hybrids is that, over a significant frequency band, the input signals applied to port $H1_1$ appear at ports $H1_3$ and $H1_4$ with ½ power, and in mutual phase quadrature, and port $H1_2$ is isolated from port $H1_1$. Similarly, signals applied to port $H1_2$ appear at ports $H1_3$ and $H1_4$ with ½ power, and in mutual phase quadrature.

FIG. 1b illustrates a common way to designate these characteristics. In FIG. 1b, the signal at port $H1_1$ is designated as (1,0), representing full power and a reference phase of 0°. The signal at port $H1_2$ resulting from application of (1,0) to port $H1_1$ is (0,0) representing zero power or no signal. The signals appearing at ports $H1_3$ and $H1_4$ as a result of application of signal (1,0) to port $H1_1$ are designated as (½,90) and (½,0), representing half-amplitude or half-power, with mutually quadrature phase shifts of 90° and 0° respectively. It should be noted that the terms "input" and "output" as applied to the ports of a hybrid refer only to its application, since the device is linear. A port termed an "input" port in one application may well be an "output" port in another application, or even in a different mode of operation of the same application.

In FIG. 1a, half-power signal A at a phase shift of 90°, corresponding to (A/2,90), appears at port $H1_3$ of hybrid H1, and half-power signal A at a phase shift of 0° (A/2,0) appears at port $H1_4$ as a result of application of (A,0) to port $H1_1$. Similarly, half-power signal B at a phase shift of 0°, corresponding to (B/2,0), appears at port $H1_3$ of hybrid H1, and half-power signal B at a phase shift of 90° (B/2,90) appears at port $H1_4$ as a result of application of (B,0) to port $H1_2$. Thus, amplifier 1 receives for amplification the sum of (A/2,90) and (B/2,0), while amplifier 2 receives (A/2,0) and (B/2,90). These signals, which may be designated (A/2,90)+ (B/2,0) and (A/2,0)+(B/2,90), respectively, appear in amplified form at the outputs of amplifiers 1 and 2 in the usual manner. While the amplifiers may invert phase, the amplification and phase inversion are not relevant to the end result, and are ignored in the discussion. Amplified summed signal (A/2,90)+(B/2,0) appears at the output of amplifier 1 for application to an input port $H2_1$ of a 3dB hybrid H2, and amplified summed signal (A/2,0)+(B/2,90) appears at the output of amplifier 2 for application to input port $H2_2$ of hybrid H2. Hybrid H2 performs the same kind of operation as hybrid H1, and more particularly couples amplified summed signal (A/2,90)+(B/2,0) from port $H2_1$ to port $H2_3$ at half power and with a relative 90° phase shift, and couples amplified summed signal (A/2,0)+(B/2,90) from port $H2_2$ to port $H2_3$ at half power and with a 0° relative phase. Similarly, hybrid H2 couples amplified summed signal (A/2, 90)+(B/2,0) from port $H2_1$ to port $H2_4$ with half-amplitude and relative phase of 0°, and couples amplified summed signal (A/2,0)+(B/2,90) applied to port $H2_2$ to port $H2_4$ with half-amplitude and a phase of 90°. The sum signal appearing at port $H2_3$, then, is (A/4,180)+(B/4,90)+(A/4,0)+(B/4,90), and the sum signal appearing at port $H2_4$ is (A/4,90)+(B/4, 0)+(A/4,90)+(B/4,180). It will be noted that the (A/4,0) and (A/4,180) components appearing at port $H2_3$ cancel, leaving (B/4,90)+(B/4,90). When adding these two signals, which are in-phase, it should be noted that B represents RF power, whereas the usual rule of addition only applies to the amplitude which happens to be the square-root of the power. Hence the amplitude of the resulting signal is $\sqrt{(B/4)} + \sqrt{(B/4)} = \sqrt{B}$, and the power of the resulting signal is therefore B. Hence the expression (B/4,90)+(B/4,90) is equivalent to (B, 90). The (B/4,0) and (B/4,180) components appearing at port $H2_4$ also cancel, leaving (A/4,90)+(A/4,90), which is equivalent to (A,90). Thus, the phase sensitivity of the hybrids at the input and output ports of amplifiers 1 and 2 allow each amplifier to amplify components of the input signals, but also allow separation or channelization of the signals following (downstream from) the parallel amplification. The output ports $H2_3$ and $H2_4$ of hybrid H2 are contiguous with output ports 20o1 and 20o2, respectively, of paralleled amplifier 20.

The arrangement of paralleling amplifiers as described in conjunction with FIGS. 1a and 1b has a salient advantage over simple use of two independent amplifiers. In general, the peak amplitude portions of two independent signals will not occur simultaneously, and thus the full output power capacity of each individual amplifier is used only a small portion of the time. This fact may be taken advantage of in a paralleled amplifier arrangement to allow the signals to be amplified to higher levels than in separate-single-amplifier arrangement. This is because the paralleled amplifiers can "apply" or "use" some of the capacity not used by the momentarily lower-level signals to accommodate that signal which is momentarily at a higher level. Thus, for example, if two amplifiers were available, each capable of producing an output power of one watt, separate use of those amplifiers, one for each channel, would restrict each channel to a maximum of one watt.

If those amplifiers were paralleled, however, the sum of the output powers would be limited to two watts, and it might be possible to allocate the entire two-watt output power to a single channel, if desired, at the expense of power in the other channels. Such an allocation of all power to a single channel is termed an Effective Isotropic Radiated Power (EIRP) flexibility of 100%.

It will be appreciated that an actual spacecraft-based communication system is likely to require more than two separate channels. If four channels, with signals A,B,C, and D are required, the desired channelization may be realized with a parallel amplifier arrangement such as that of FIG. 2a. In FIG. 2a, a paralleled amplifier 220 includes four amplifiers organized as two paralleled amplifiers 20, identical to those described in conjunction with FIG. 1a. To distinguish between the two paralleled amplifiers 20 of FIG. 2a, they are designated $20_1$, and $20_2$. The input ports of the paralleled amplifier $20_1$, are designated $20i_{1,1}$ and $20i_{2,1}$, and the input ports of paralleled amplifiers $20_2$ are designated $20i_{1,2}$ and $20i_{2,2}$. In each of paralleled amplifiers $20_1$ and $20_2$ of FIG. 2a, the input hybrid, designated H1 in FIG. 1a, is redesignated as 31, and the output hybrid, H2 in FIG. 1a, is redesignated 32. Each of the paralleled amplifiers $20_1$ and $20_2$ may be viewed as being equivalent to a single amplifier 1 or 2 of FIG. 1a, requiring only some sort of cross-coupling to get A and B signals to paralleled amplifier $20_2$, and to get the C and D signals to paralleled amplifier $20_1$. For this purpose, the A signals applied to paralleled amplifier 220 of FIG. 2a are coupled to input port 1 of a 3 dB hybrid 230, and the B input signals are applied to its input port 2. Similarly, the C input signals to paralleled amplifier 220 are applied to input port 1 of a 3 dB hybrid 232, and the D input signal is applied to its input port 2. Output port 3 of hybrid 230 is coupled to input port $20i_{11}$ of paralleled amplifier $20_1$, and output port 4 of hybrid 232 is coupled to input port $20i_{22}$ of paralleled amplifier $20_2$. Cross-coupling is provided by connecting, output port 4 of hybrid 230 to input port $20i_{12}$ of paralleled amplifier $20_2$, and output port 3 of hybrid 232 is coupled to input port $20i_{21}$ of paralleled amplifier $20_1$. With this arrangement, each of the four amplifiers contained in the combination of two paralleled amplifiers $20_1$ and $20_2$ amplifies signals including components of signals A, B, C, and D.

Also in FIG. 2a, output port 20o1 of paralleled amplifier $20_1$ is coupled to port 1 of a 3 dB hybrid 234, and output port 20o2 of paralleled amplifier $20_2$ is coupled to input port 2 of hybrid 236. Output port 20o2 of paralleled amplifier $20_1$ is coupled to port 1 of a 3 dB hybrid 236, and output port 20o1 of paralleled amplifier $20_2$ is coupled to input port 2 of hybrid 234. Following an analysis such as that described in conjunction with FIG. 1a, it is easy to show that the A and B signals applied to input ports 1 and 2, respectively, of hybrid 230, and the C and D signals applied to input ports 1 and 2, respectively, of hybrid 232, are separately generated, in amplified form, at the output ports of hybrids 234 and 236. More particularly, the A output is produced at port 4 of hybrid 236, the B signal is produced at output port 3 of hybrid 236, the C signal is produced at output port 4 of hybrid 234, and the D signal is produced at output port 3 of hybrid 234. It will be noted that, as in the arrangement of FIG. 1a, the output signals appear at the "opposite" output port from the port at which they entered, and thus signal A enters at the "top" of the structure, and exits at the "bottom," while signal D enters at the "bottom" and exits at the "top." In such a four-amplifier system, there is the possibility of allocation of the entire output power of the paralleled amplifiers (four watts, for the case of one-watt amplifiers) to a single signal or channel, at the expense of the other signals; this would also correspond to an EIRP flexibility of 100%.

FIG. 2b represents the arrangement of FIG. 2a in a skeletonized form, with the amplifiers redesignated as amplifiers 1, 2, 3, and 4, and with the hybrids undesignated. The input and output ports of the paralleled amplifier arrangement of FIG. 2b are designated by the signal or channel designation, namely A, B, C, and D. The representation of FIG. 2b is easier to understand than that of FIG. 2a since it is less "busy."

It will be noted in the arrangement of FIG. 2b that an input signal applied to any one of paralleled amplifier input ports A, B, C, or D is split by the first set of hybrids, and split again by the second set of hybrids, before being applied to the input ports of the individual amplifiers. In other words, the signals applied to any one input port flow equally through all the four amplifiers.

If a larger number of channels than four must be handled, the prior art treats the four paralleled amplifiers of FIGS. 2a and 2b as a single amplifier, and uses two such paralleled amplifier arrangements, altogether including eight separate amplifiers, together with a cross-coupling arrangement for coupling all of the input signals to all of the eight amplifiers. FIG. 3 illustrates an eight-channel arrangement including the parallel combination of eight amplifiers. In the arrangement of FIG. 3, amplifiers 1, 2, 3, and 4 may be viewed as part of a four-paralleled amplifier arrangement $320_1$, similar to the arrangement of 220 of FIGS. 2a and 2b, and amplifiers 5, 6, 7, and 8 may be viewed as part of a four-paralleled-amplifier arrangement $320_2$, also similar to the arrangement 220. Taking this view, paralleled amplifiers $320_1$ and $320_2$ are cross-coupled by a set 330 of hybrids, including hybrids 330AB, 330CD, 330EF, and 330GH. Hybrid 330AB couples signals A and B from input terminals at the left of FIG. 3 to paralleled amplifier $320_1$, while hybrid 330cd couples signals C and D from correspondingly designated input terminals to paralleled amplifier $320_1$. Hybrid 330EF couples signals E and F to paralleled amplifier $320_1$, while hybrid 330GH couples signals G and H to paralleled amplifier $320_1$. Similarly, hybrid 330AB couples signals A and B to paralleled amplifier $320_2$, while hybrid 330cd couples C and D to paralleled amplifier $20_2$. Hybrid 330EF couples signals E and F to paralleled amplifier $320_2$, while hybrid 330GH couples signals G and H to paralleled amplifier $320_2$. At the output end of the eight-paralleled-amplifier arrangement 320 of FIG. 4, another set 340 of hybrids, namely hybrids 340GH, 340EF, 340CD, and 340AB, provides corresponding phase-sensitive cross-coupling which results in separation of the A, B, C, D, and E signals at the correspondingly designated output terminals at the right of FIG. 3. This scheme also has an EIRP flexibility of 100%. The arrangement of FIG. 3 corresponds to that described in U.S. Pat. No. 4,618,831, issued Oct. 21, 1986 in the name of Egami et al.

It should be apparent at this stage of the description of the prior art that the technique used in the prior art to parallel amplifiers produces amplifier arrangements which have $2^N$ amplifiers and a similar number of channels, where N is an integer. In the arrangement of FIGS. 1a and 1b, N=1, in FIGS. 2a and 2b, N=2, and in the arrangement of FIG. 3, N=3. Thus, the number of paralleled amplifiers which can be produced by this scheme include 2, 4, 8, 16, 32, . . . If more channels than eight are required, the next step up in the prior art scheme produces sixteen paralleled amplifiers (the combination of two eight-channel amplifiers, suitably cross-coupled). Such a sixteen-amplifier combination is described in the abovementioned Egami et al. patent application. In any such arrangement, the signals applied to any input port are divided so as to flow in equal amounts through each of the individual amplifiers.

It often happens that a number of channels is required which is not an integer power of two. This might occur, for example, if a ten-channel system is desired. It is clear that an eight-channel amplifier corresponding to that of FIG. 3 is insufficient, but a sixteen-channel system (the next step up), such as that described in the abovementioned Egami et al. patent, has supernumerary channels. Such supernumerary channels are undesirable, because each such channel requires its own amplifier and hybrids, which adds weight, complexity, and cost to the spacecraft, and each amplifier requires a portion of the scarce electrical resources of the spacecraft. Furthermore, travelling-wave tube amplifiers, or other types of amplifiers, may not be available for the desired power levels if particular numbers of amplifiers are used; if the system specifies ten channels with an output power of one watt per channel, the use of ten amplifiers requires one-watt amplifiers, which may be available, but the use of sixteen amplifiers requires 620-milliwatt amplifiers, which may not be available. In most applications, the disadvantages of a system with supernumerary channels preclude its use.

It should be noted that the intermodulation distortion of paralleled-amplifier arrangements relative to the prior art single-amplifier-per-channel scheme depends at least in part on the traffic or signal loading. Single frequency modulated television signals (FMTV) and single time-division multiplex (TDMA) signals tend to have lower cross-modulation and intermodulation when amplified in separate amplifiers than in paralleled amplifiers, while traffic including multiple carriers, as in mobile applications (where each beam is treated as a separate channel) provide the same performance in both the separate-amplifier and paralleled-amplifier schemes. If more amplifiers are used than the number of channels which are to be handled in a paralleled-amplifier arrangement, it is possible to divert at least some intermodulation and cross-modulation products to unused ports, thereby allowing improved performance for the paralleled-amplifier arrangements.

FIG. 4 is a simplified block diagram of a ten-channel paralleled-amplifier 420 such as might be used in the prior art in a ten-channel communication system. In FIG. 4, portion 320 is similar to the eight-channel amplifier of FIG. 3, and its separate portions are not designated individually. In the arrangement of FIG. 4, eight-paralleled amplifier 420 handles channels or signals designated A, B, C, D, E, F, G, and H. Also in FIG. 4, a two-amplifier paralleled arrangement 420 similar to 20 of FIG. 1 is provided for handling channels or signals I and J. This arrangement is functional, and has the advantage of providing but a single amplifier for each channel, but suffers from the disadvantage that the EIRP flexibility is no longer 100%. Instead, the total system power (for one-watt amplifiers) is ten watts, but signals in the two-amplifier portion 420 can have a maximum output level of two watts, which corresponds to an EIRP flexibility of 20%, and the corresponding EIRP flexibility of eight-amplifier portion 320 is 8 watts out of ten, or 80%. In other words, signals applied to input ports I and J can draw power from only two amplifiers, rather than be capable of drawing power from eight amplifiers, as with signals applied to input ports A through H.

More flexible paralleled amplifier arrangements are desired.

SUMMARY OF THE INVENTION

A paralleled amplifier arrangement, according to an aspect of the invention, includes an amplifier set including a plurality of amplifiers. Each of the amplifiers of the amplifier set includes an input port and an output port. The number of the amplifiers in the amplifier set associated with the paralleled amplifier arrangement, according to the invention, is an even number M which is not an integer power of two. The paralleled amplifier arrangement includes a plurality of input ports, equal in number to the number of input ports associated with the amplifier set. The paralleled amplifier arrangement also includes a plurality of output ports, equal in number to the plurality of output ports of the amplifier set. The paralleled amplifier arrangement includes an input combining arrangement including a number {(M/2) int(log$_2$ M)} of input hybrids, connected in such a manner that a signal applied to any one of the input ports of the paralleled amplifier arrangement passes through the same number of the paralleled amplifiers as a signal applied to any other input port. The paralleled amplifier arrangement further includes an output combining arrangement coupled to the output ports of the plurality of amplifiers, and to the output ports of the paralleled amplifier arrangement. The output combining arrangement includes a plurality of output hybrids, equal in number to the number of input hybrids in the input combining arrangement, connected in a mirror-image manner relative to the connections of the input hybrids.

BRIEF DESCRIPTION OF THE DRAWING

FIGS. 6b and 6c are more detailed representations of the input and output hybrid blocks of the arrangement of FIG. 6a;

FIG. 7a is a table setting forth the parameters of the arrangement of FIG. 6b as they relate to the defining equations, FIG. 7b is a table equivalent to that of FIG. 7a, but for a twelve-paralleled amplifier arrangement, and FIG. 7c is a simplified representation of two stages of hybrid using the designations of the table of FIG. 7a;

DESCRIPTION OF THE INVENTION

Figure 1A:
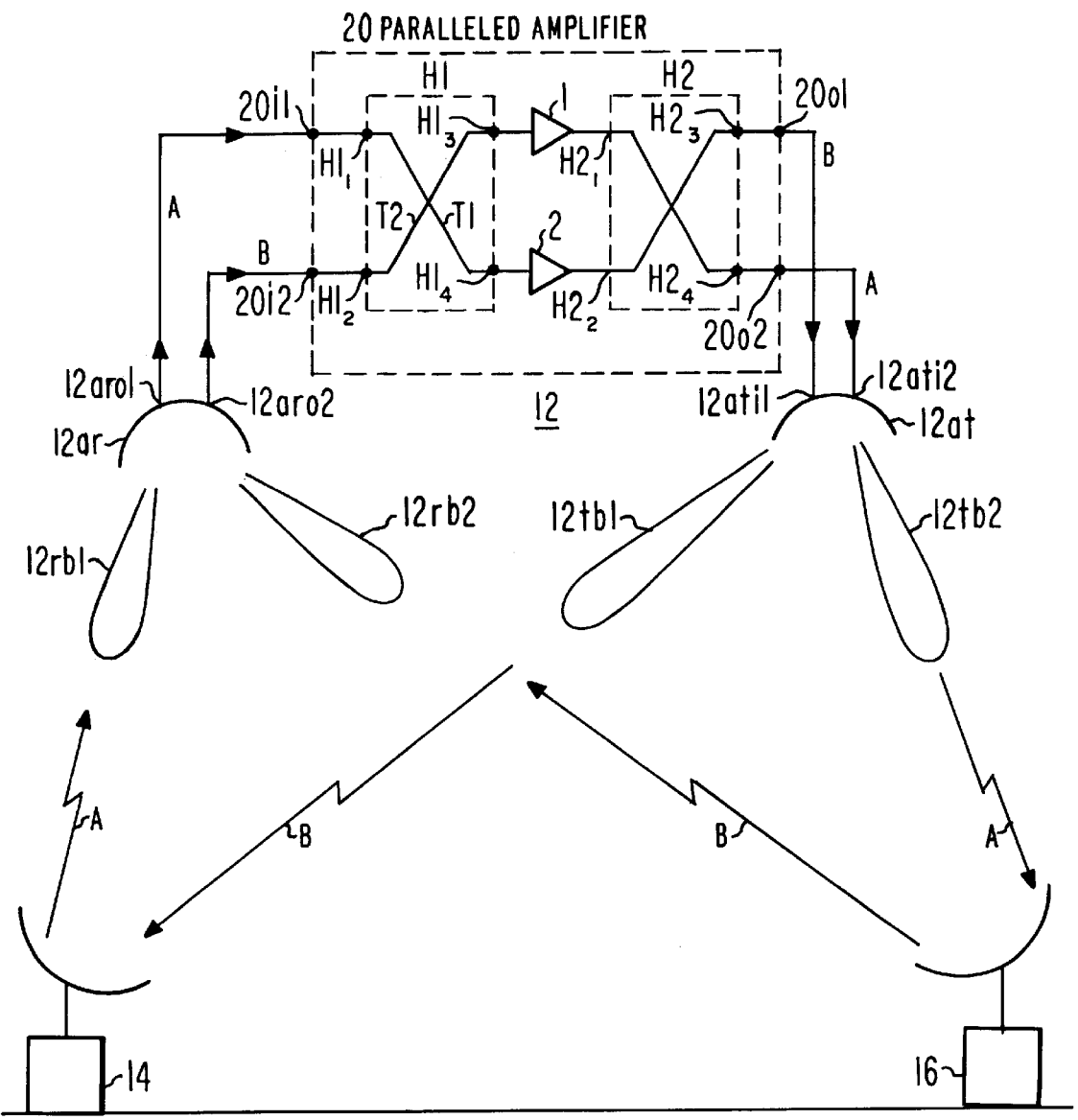
FIG. 1a is a simplified representation of a spacecraft communication system using a prior-art paralleled amplifier arrangement.
Figure 1B:
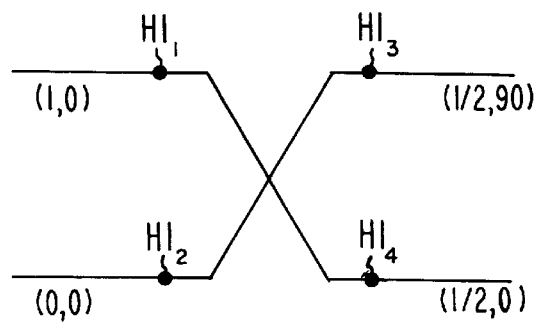
FIG. 1b is a simplified representation of a hybrid which may be used with the parallel amplification, illustrating one form of notation.
Figure 2A:
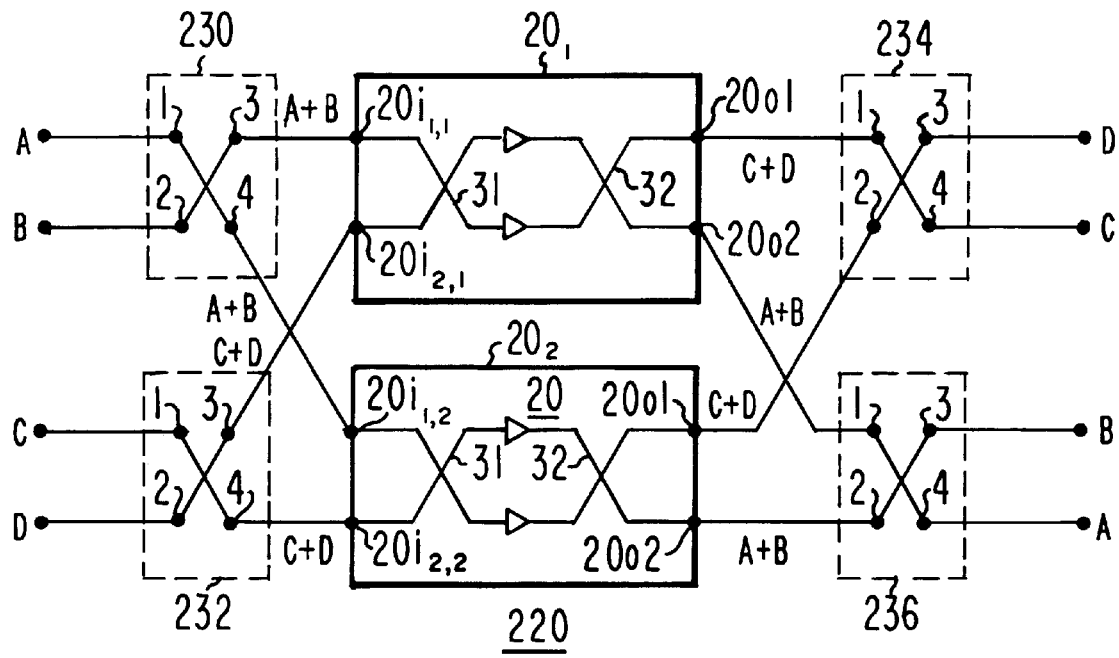
FIG. 2a is a simplified representation of a prior-art $2^N$ paralleled amplifier arrangement, where N is 2, containing four amplifiers.
Figure 2B:
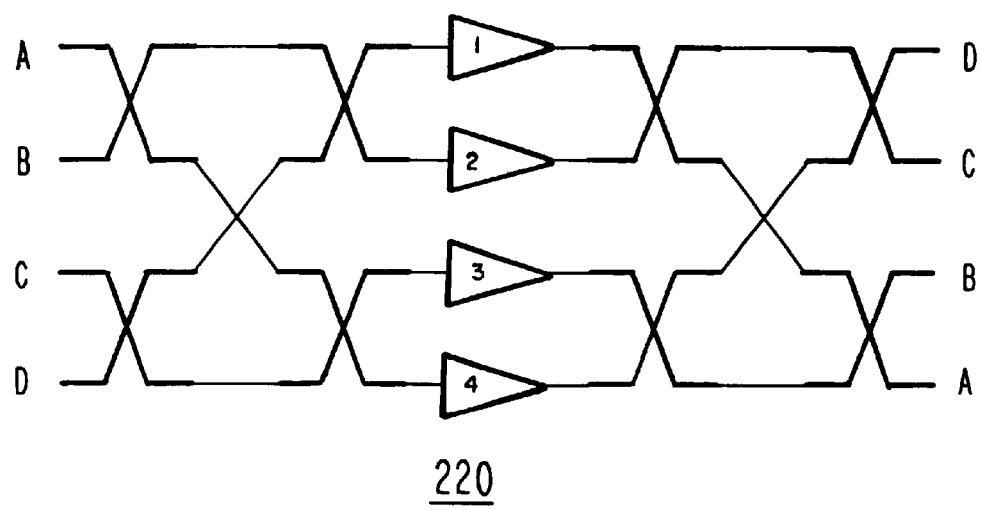
FIG. 2b is a representation of the arrangement of FIG. 2a using slightly different notation.
Figure 3:
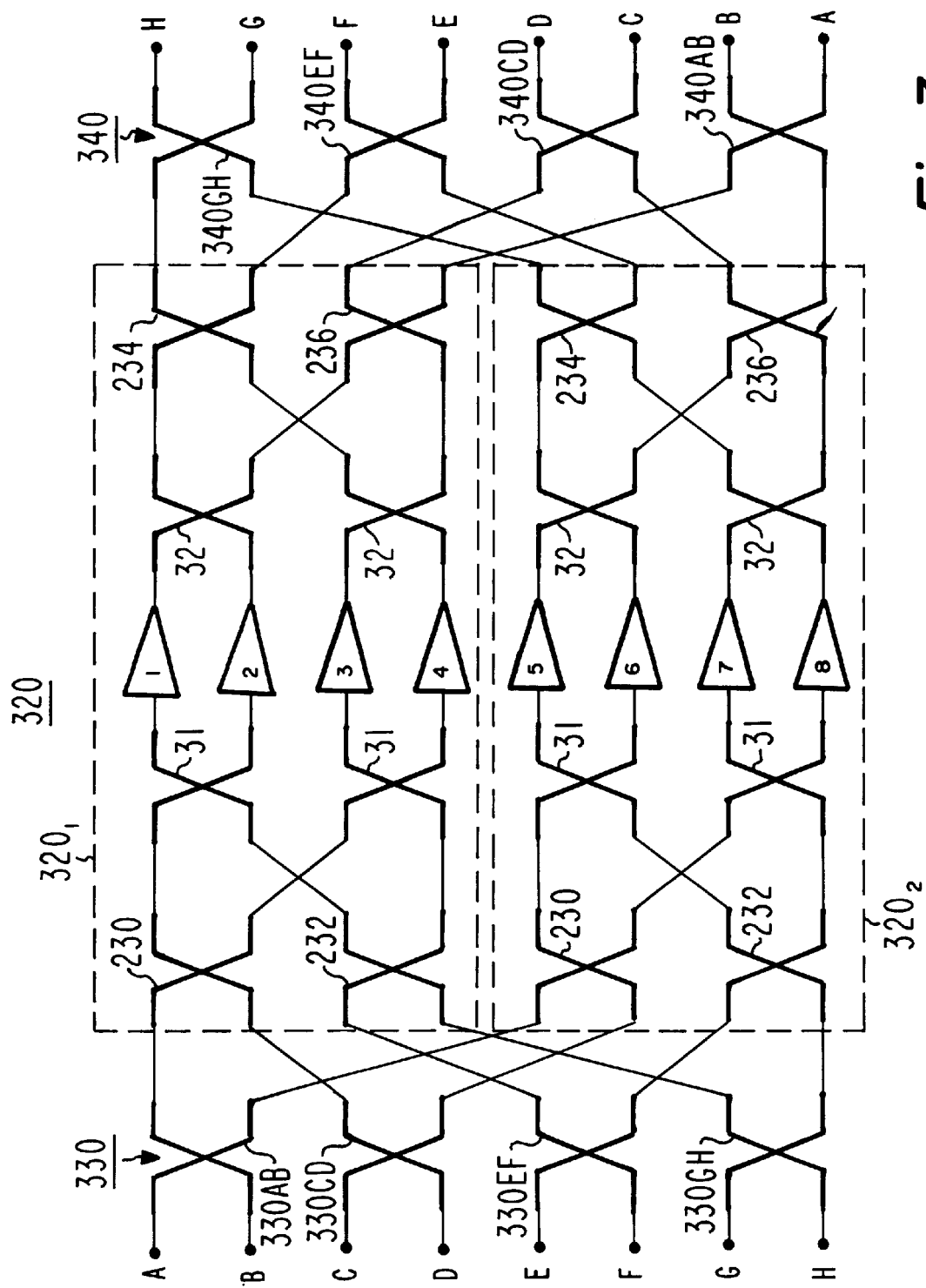
FIG. 3 is a simplified representation of a prior-art $2^N$ paralleled amplifier arrangement, where N is 3, containing eight amplifiers.
Figure 5B:
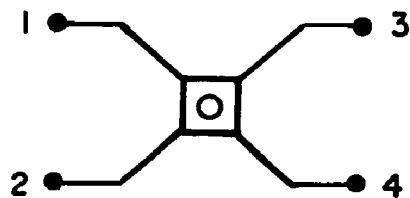
FIG. 5b illustrates the symbol which is used hereinafter to represent such a conventional or "output" hybrid.
Figure 5A:
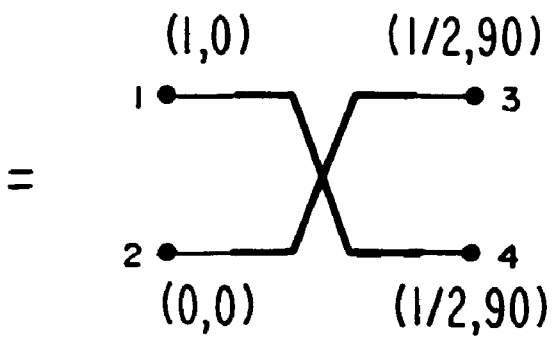
FIG. 5a is a simplified representation of a conventional hybrid such as those used in the prior art.
Figure 5D:
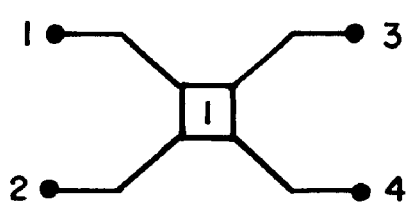
FIG. 5d illustrates the symbol (I) which is used hereinafter to represent such a switched-conventional or "input" hybrid.
Figure 5C:
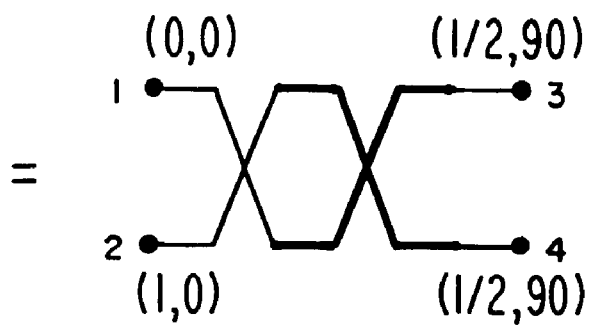
FIG. 5c is a simplified schematic representation of a conventional hybrid with its "input" ports inverted or reversed.

FIG. 5a illustrates a conventional hybrid, such as those described in conjunction with FIGS. 1b and 2a, with the port numbering as in FIG. 2b, namely with "input" ports 1 and 2, and "output" ports 3 and 4. It will be recalled that each port 1, 2, 3, or 4 can be an input port, and that the distribution of power from the input port to the other ports depends upon the configuration of the hybrid. FIG. 5b represents the symbol which is used to represent the conventional hybrid of FIG. 5a hereinafter. Basically, the representation is that of a box with the letter "O," which refers to the word "output." As described below, the output hybrids are used in the output combining network of a paralleled amplifier in accordance with an aspect of the invention. FIG. 5c represents a conventional hybrid, in which the connections of the "input" ports 1 and 2 of the hybrid are reversed relative to those of FIG. 5a. FIG. 5d represents the symbol which is used to represent the reversed-connection hybrid of FIG. 5c. The representation is basically of a box with the identifying letter I, representing the word "input," referring to the use of such reversed-connection hybrids at the input dividing network of a paralleled amplifier according to an aspect of the invention. FIG. 5a also illustrates, adjacent each port of the hybrid, the relative power and phase, in the format (P,), assuming that a signal of 1 watt, 0° is applied to port 1. As illustrated, half the power at 90° phase exits from each output port 3 and 4, and no power exits from port 2. The same symbology is used to designate the corresponding power and phase relations in the input hybrid arrangement of FIG. 5c, illustrating that, if 1 watt at 0° is applied to port 2, power ½ exits from ports 3 and 4 with phases 90°, and no power exits from port 1.

Figure 6A:
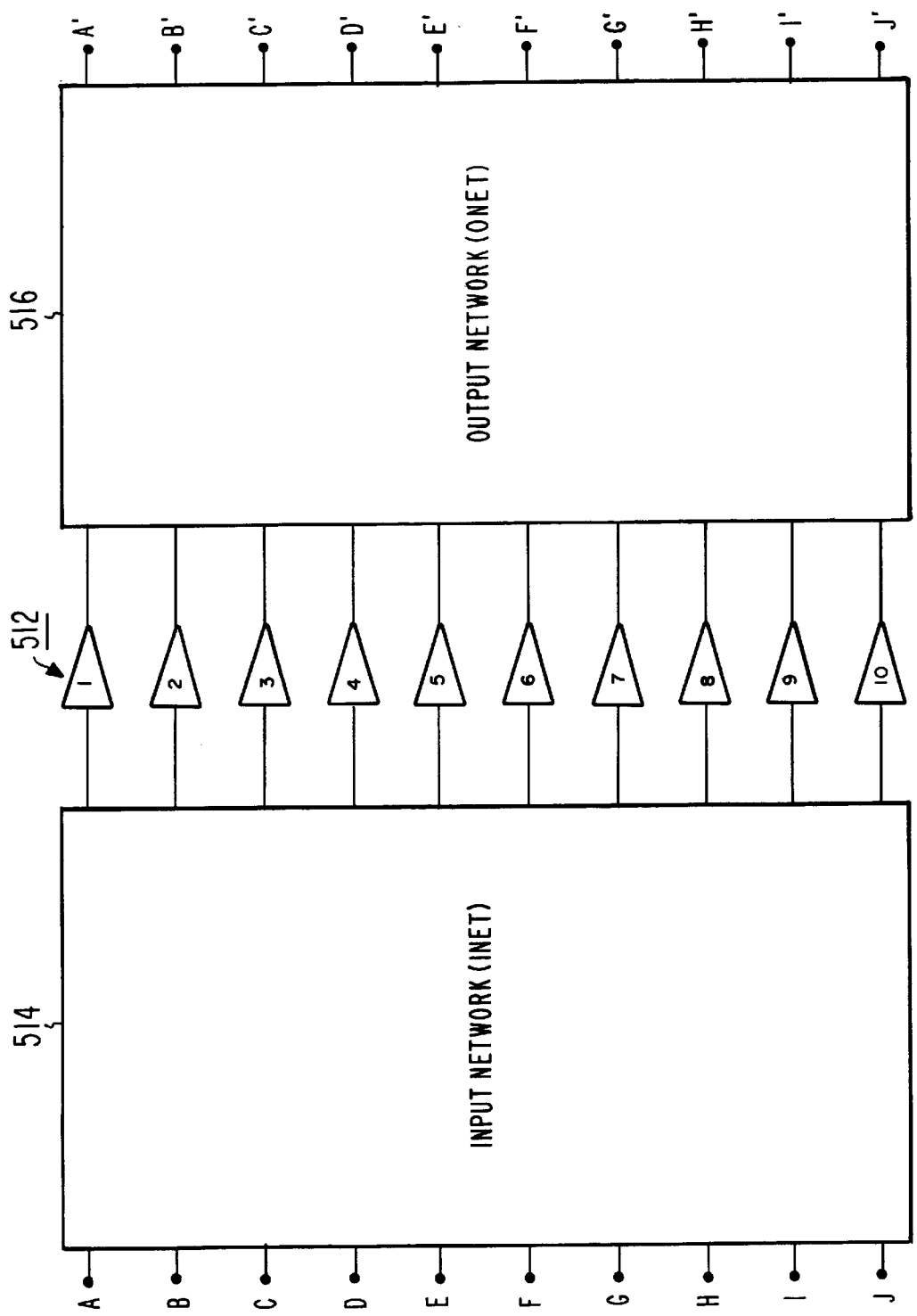
FIG. 6a is a simplified representation of a ten-amplifier paralleled amplifier arrangement according to an aspect of the invention, in which the EIRP flexibility is 80% for each input signal, and in which an input hybrid arrangement and a corresponding mirror-image output hybrid arrangement are illustrated as blocks.

FIG. 6a is a simplified representation of a paralleled amplifier arrangement 510 according to an aspect of the invention, in which a set 512 of ten amplifiers are paralleled. There are ten input ports, designated A, B, C, D, E, F, G, H, I and J of the paralleled amplifier arrangement. The ten amplifiers of set 512 is arrayed in the direction of an axis or plane 8, and each of the amplifiers 1, 2, 3, 4, 5, 6, 7, 8, 9, 10 of the paralleled amplifier arrangement 510 has a single input port (at its left side or at the broad side of the amplifier symbol) and a single output port (on the right side or at the pointed end of the amplifier symbol) available for signal flow. As illustrated in FIG. 6a, paralleled amplifier arrangement 510 input ports A, B, C, D, E, F, G, H, I and J are coupled to the input ports of amplifiers 1, 2, 3, 4, 5, 6, 7, 8, 9, 10 by an input network (INET) 514.

Figure 6B:
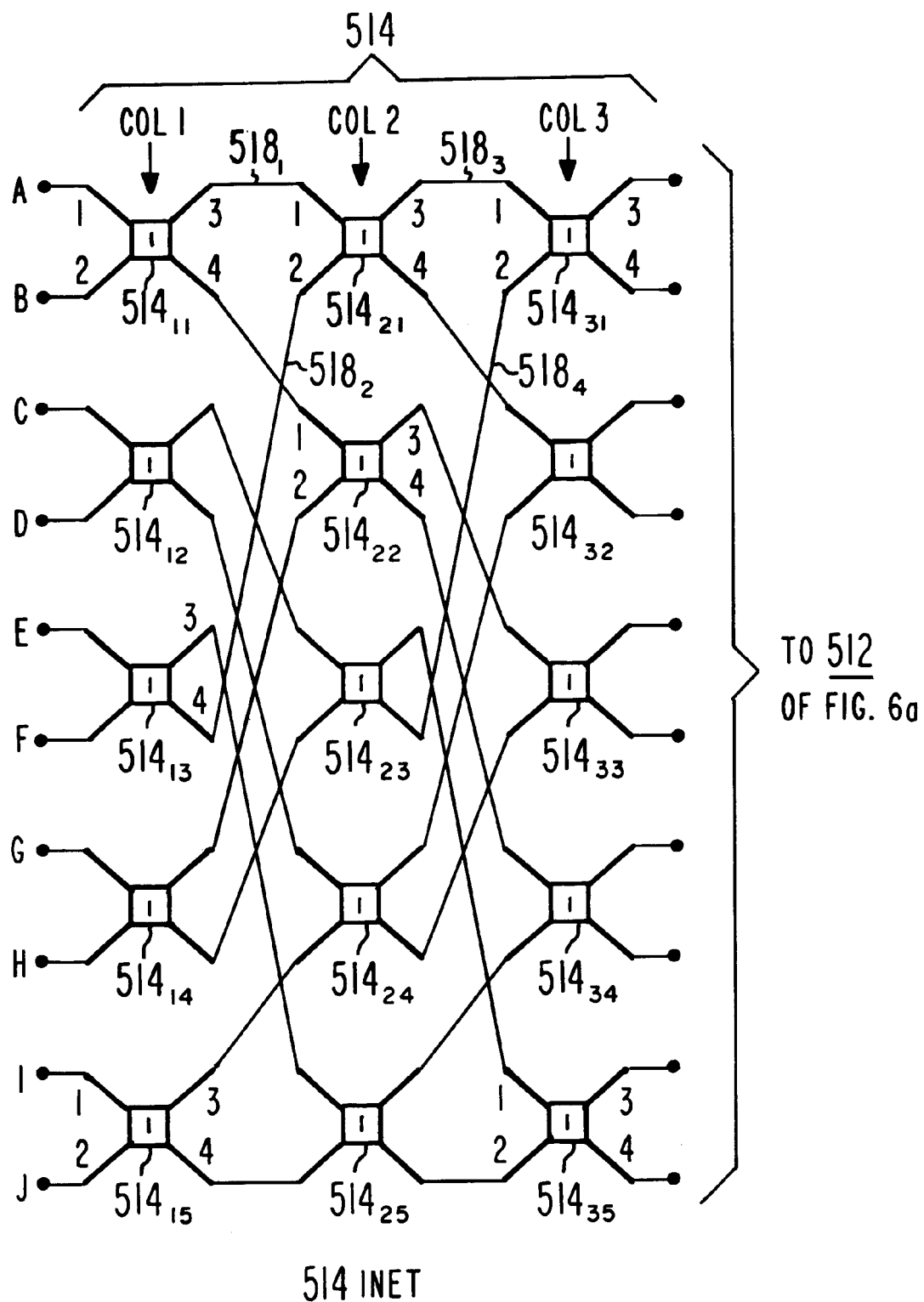
Figure 6C:
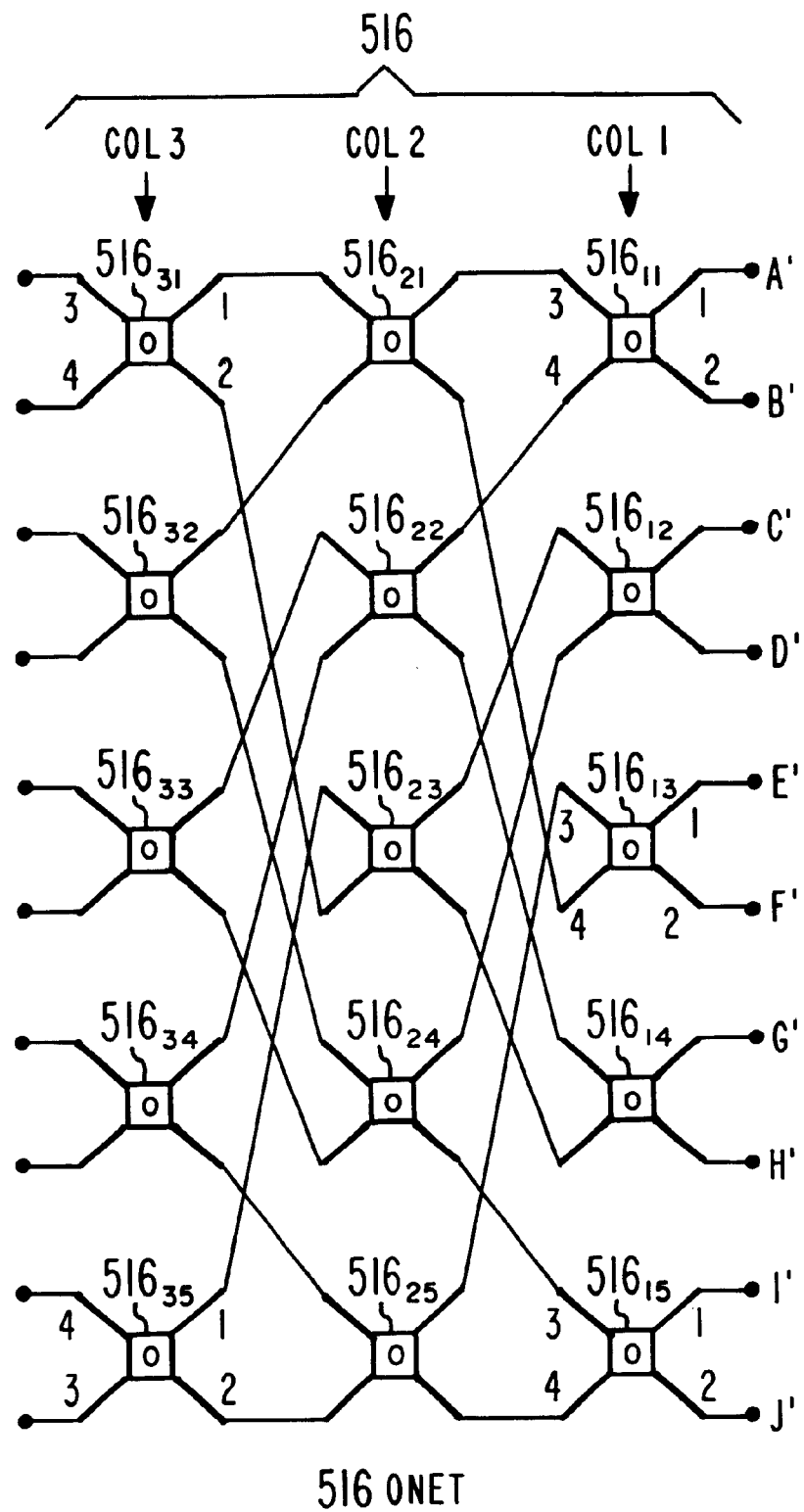

FIG. 6b illustrates details of INET 514 of FIG. 6a, and FIG. 6c illustrates details of ONET 516. As illustrated in FIG. 6b, the input network consists of a plurality of "input" (I) hybrids. These hybrids are {(M/2) (log$_2$ M')} in number, where M is the number of individual amplifiers in the paralleled amplifier arrangement and M' is the largest power of 2 which is less than M. In the arrangement illustrated in FIG. 6a, M=10, so the largest power of 2 which is less than 10 is 8. Since log$_2$ 8=3, there are {(10/2)×3} hybrids in the input dividing network of FIG. 6b. The hybrids of the input network are all of the input (I) type.

Also in FIG. 6a, the paralleled amplifier arrangement 510 includes ten output ports, designated as A', B', C', D', E', F', G', H', I' and J'. The set 512 of ten amplifiers 1, 2, 3, 4, 5, 6, 7, 8, 9, 10 is coupled to the set of output ports A', B', C', D', E', F', G', H', I', and J' by a output network (ONET) 516. Reference to FIG. 6c shows that ONET 516 includes a set 516 of "output" (O) hybrids. The number of hybrids in output set 516 equals the number of hybrids in the input hybrid set 514.

In FIGS. 6b and 6c, the input hybrids are illustrated as being arrayed in three columns and five rows, where the column numbering starts at the row most remote from the paralleled amplifier set 512. In FIG. 6b, the column numbering starts at the column marked "col. 1". For simplicity, the designations of the input hybrids of FIG. 6b are given by the numeral 514$_{CR}$, where C represents the column, and R the row. Thus, the input hybrids of the first column of set 514 are designated 514$_{11}$, 514$_{12}$, 514$_{13}$, 514$_{14}$, and 514$_{15}$. Similarly, the input hybrids of the second column of set 514 are designated 514$_{21}$, 514$_{22}$, 514$_{23}$, 514$_{24}$, and 514$_{25}$, and the input hybrids of the third column are designated 514$_{31}$, 514$_{32}$, 514$_{33}$, 514$_{34}$, and 514$_{35}$. Each input hybrid of set 514 of FIG. 6b has ports denominated in the same manner as those of FIGS. 5c and 5d, namely by the numerals 1, 2, 3, and 4. For simplicity, the port designations are only provided for input hybrids 514$_{11}$, 514$_{13}$, 514$_{15}$, 514$_{22}$, 514$_{24}$, 514$_{31}$, 514$_{33}$, and 514$_{35}$. In FIG. 6c, the output hybrids are illustrated as being arrayed in three columns and five rows, where the column numbering starts at the column most remote from the paralleled amplifier set 512, which is the column marked "col. 1". For simplicity, the designations of the output hybrids are given by the numeral 516$_{CR}$, where C represents the column, and R the row. Thus, the output hybrids of the first column of set 516 are designated 516$_{11}$, 516$_{12}$, 516$_{13}$, 516$_{14}$, and 516$_{15}$. Similarly, the output hybrids of the second column of set 516 are designated 516$_{21}$, 516$_{22}$, 516$_{23}$, 516$_{24}$, and 516$_{25}$, and the output hybrids of the third column are designated 516$_{31}$, 516$_{32}$, 516$_{33}$, 516$_{34}$, and 516$_{35}$. Each output hybrid of set 516 of FIG. 6c has ports denominated in the same manner as those of FIGS. 5a and 5b, namely by the numerals 1, 2, 3, and 4. For simplicity, the port designations are only provided for output hybrids 516$_{11}$, 516$_{13}$, 516$_{15}$, 516$_{22}$, 516$_{24}$, 516$_{31}$, 516$_{33}$, and 516$_{35}$.

The input ports 1 and 2 of each hybrid of column 1 of INET 514 of FIG. 6b are connected to a corresponding pair of input ports of paralleled amplifier arrangement 510 of FIG. 6. More particularly, input ports 1 and 2 of hybrid 514$_{11}$ are connected to paralleled amplifier input ports A and B, respectively. Similarly, input ports 1 and 2 of hybrid 514$_{12}$ are connected to paralleled amplifier input ports C and D, respectively, input ports 1 and 2 of hybrid 514$_{13}$ are connected to paralleled amplifier input ports E and F, respectively, input ports 1 and 2 of hybrid 514$_{14}$ are connected to paralleled amplifier input ports G and H, respectively, and input ports 1 and 2 of hybrid 514$_{15}$ are connected to paralleled amplifier input ports I and J, respectively. Also, output ports 1 and 2 of hybrid 516$_{11}$ of ONET 516 of FIG. 6c are connected to paralleled amplifier output ports A' and B', respectively. similarly, output ports 1 and 2 of hybrid 516$_{12}$ are connected to paralleled amplifier input ports C' and D', respectively, output ports 1 and 2 of hybrid 516$_{13}$ are connected to paralleled amplifier output ports E' and F', respectively, output ports 1 and 2 of hybrid 516$_{14}$ are connected to paralleled amplifier output ports G' and H', respectively, and output ports 1 and 2 of hybrid 516$_{15}$ are connected to paralleled amplifier output ports I' and J', respectively.

For purposes of analysis, let the signal output of the $j^{th}$ port of the $i^{th}$ hybrid in the $k^{th}$ column be $O_k[i,j]$, and its signal input $I_k[i,j]$. In such an arrangement, j can be either 1 or 2, corresponding to the numbering of the input port, i varies from 1 to (M/2), and k varies from 1 to $\log_2 M'$. Thus, in a ten-individual-amplifier paralleled amplifier arrangement, M=10, so i can vary from 1 to 5, and k can vary from 1 to 3. With these designations, the connections between the $k^{th}$ and $(k-1)^{th}$ columns, for k>1, is given by $$I_k[i,j]=O_{k-1}[int(((i-1)+(j-1)M/2)/2)+1, (i-1+(j-1)M/2) \bmod 2+1] \quad (1)$$

for:

i (the row in which the hybrid resides)=1, 2, . . . , M/2;
j (port of the hybrid)=1,2;

k (column in which the hybrid resides)=1, 2, . . . , $\log_2 M'$, where M' represents the largest number less than or equal to M which is an integer power of two; for M=10, M'=8.

For j=1, corresponding to the $1^{st}$ port of an input hybrid (the port designated "1" in FIG. 6b or 6c ), equation (1) becomes $$I_k[i,1]=O_{k-1}[int((i-1)/2)+1, (i-1)M/2 \bmod 2+1] \quad (2)$$

and for j=2, corresponding to the $2^{nd}$ input port of an input hybrid (the port designated "2" in FIG. 6), equation (1) takes the form $$I_k[i,2]=O_{k-1}[int(((i-1)+M/2)/2)+1, (i-1+M/2) \bmod 2+1] \quad (3)$$

It can be seen from equation (1) that the connections between successive columns are the same in both the input and output hybrid networks.

Thus, in FIGS. 6a, 6b, and 6c, the connections of the hybrids of input network 514 and of output network 516 are both given by equation (1). More particularly, applying equation (2) to hybrid 514$_{21}$ of column 2 (k=2) and row 1 (i=1) of FIG. 6b, in order to begin to establish the interconnections between columns 1 and 2, we find that the connection to the input port 1 of a hybrid of the 2nd stage is given by plugging into equation (2)

$$I_2[1,1]=O_1[int(0/2)+1, 0 \bmod 2+1] \quad (4)$$

which corresponds to $$I_2[1,1]=O_1[1,1] \quad (5)$$

in which the $I_2$ refers to the connection to the input of a second stage hybrid, and, in "[1,1]," the first "1" refers to the hybrid in the first row, and the second "1" refers to the first port (port 1) of the hybrid. Thus, equation (5) which means that the first input port (the port designated 1) of the hybrid 514$_{21}$ in the first row, second column is connected to the first output port (the port designated 3) of the hybrid 514$_{11}$ in the first row of the first column. This connection is designated 518$_1$ in FIG. 6b. The calculation steps are set forth in summary form in the corresponding row (Hybrid #1, Port #1) of the table of FIG. 7a.

In order to determine the connection of the second input port 2 (j=2) of the hybrid 514$_{21}$ occupying the first row (i=1) in the second column (k=2) of FIG. 6b, equation (3) is used $$I_2[1,2]=O_1[int((1-1+10/2)/2)+1, (1-1+10/2) \bmod 2+1] \quad (6)$$

$$I_2[1,2]=O_1[int(5/2), 1+1] \quad (7)$$

$$I_2[1,2]=O_1[int(2.5)+1,2] \quad (8)$$

$$I_2[1,2]=O_1[3, 2] \quad (9)$$

where $I_2$ refers to an input port of a hybrid of the second column, and the first "1" in "[1,2]" refers to a hybrid in the first row, while the "2" refers to the second input port. Thus, equation (9) means that the second input port (port designated 2) of the hybrid 514$_{21}$ occupying the location in the first row, second column, is connected to the second output port (port designated 4) of that hybrid 514$_{13}$ in the third row of the first column, third row. This connection is designated 518$_2$ in FIG. 6b, and the steps of the determination are set forth in the second row (Hybrid #1, Port #2) of the table of FIG. 7a.

The output connections for the hybrid 514$_{21}$ of FIG. 6b are determined by the connections to the input ports, using equations (2) and (3), applied to the hybrids of the third column. Thus, taking the hybrid $514_{31}$ located in the first row (i=1), third column (k=3), the connection for the first input port (port 1), for which j=1, is determined by plugging into equation (2) in the same way as for the corresponding input port of hybrid $514_{21}$ in the equivalent position in the second column. As it happens, plugging the values for the first row, third column into equation (2) produces the same result as that for the first row, second column, namely $$I_3[1,1]=O_2[\text{int}(0/2)+1,0 \text{ mod } 2+1] \quad (10)$$

which corresponds to $$I_3[1,1]=O_2[1,1] \quad (11)$$

which means that the first input port (the port designated 1) of the hybrid $514_{31}$ in the first row, third column is connected to the first output port (the port designated 3) of the hybrid $514_{21}$ in the first row of the second column. This connection is designated $518_3$ in FIG. 6b, and the calculation is again summarized in the first row (Hybrid #1, Port #1) of FIG. 7. This connection $518_3$, in turn, establishes one of the two output connections for hybrid $514_{21}$.

Similarly, other output connections of the input hybrids of the second column of input portion 514 of FIG. 6b are determined by the connections to the input ports of the hybrids of the third column of the input portion 514. For example, to find the input connection for the second input port (the port designated 2) of input hybrid $514_{31}$ in the first row, third column of FIG. 6b, the salient values are i=1, j=2, and k=3, and equation (3) is used since j=2. Plugging into equation (3)

$$I_k[i,2]=O_{k-1}[\text{int}((i-1+M/2)/2), (i-1+M/2) \text{ mod } 2+1] \quad (3')$$

one obtains the equivalent of equations (6), (7), (8), and (9)

$$I_3[1,2]=O_2[\text{int}((1-1+10/2)/2)+1, (1-1+10/2) \text{ mod } 2+1] \quad (12)$$

$$I_3[1,2]=O_2[\text{int}(5/2)+1, (5) \text{ mod } 2+1] \quad (13)$$

$$I_3[1,2]=O_2[\text{int}(2.5)+1,1+1] \quad (14)$$

$$I_3[1,2]=O_2[3, 2] \quad (15)$$

which means that the second input port (port designated 2) of the hybrid $514_{31}$ occupying the location in the first row, third column, is connected to the second output port (port designated 4) of that hybrid $514_{23}$ in the second column, third row. This connection is designated $518_4$ in FIG. 6b, and the calculation is summarized in row 2 (Hybrid #1, Port #2) of FIG. 7a.

Comparing the connections $518_3$ and $518_4$ of FIG. 6b with connections $518_1$ and $518_2$, it is apparent that equation (1) as applied to determine the input port connections of the input hybrid in the first row, second column, when applied to the input hybrid occupying the first row, third column, results in corresponding connections to the preceding column. This pattern constancy applies to the other rows of the structure of FIG. 6b. Thus, the summary of FIG. 7a applies to any column of the input portion 514 of a structure such as that of FIG. 6b.

As a further example of the use of equation (1) to determine the connections of an input hybrid, consider input hybrid $514_{23}$ of FIG. 6b. For a determination of the connection of the first input port of hybrid $514_{23}$, the appropriate equation is for j=1, which corresponds to equation (2)

$$I_{k[i, 1]}=O_{k-1}[\text{int}((i-1)/2)+1, (i-1) \text{ mod } 2+1] \quad (2)$$

Plugging values i=3 and k=2 into equation 3 gives $$I_2[3,1]=O_1[\text{int}(1)+1,2 \text{ mod } 2+1] \quad (16)$$

$$I_2[3,1]=O_1[2,1] \quad (17)$$

which indicates that the input port in question in the second column, in the hybrid in the third row, and the first port, is connected to an output port in the first column, and in that first column, the output port is one in the second row, it is the first output port (port designated 3 of hybrid $514_{12}$. This connection is designated $518_5$.

The connections for any one of the hybrids in the input combining network of FIG. 6b can be determined by recourse to equations (2) and (3), or alternatively from the table of FIG. 7a.

The connections of the output combining network 516 of FIG. 6c can be found from equations (2) and (3) by redesignating the columns to begin at column 1 with the last column, and the ports of the hybrids are also redesignated, as shown in FIG. 6c. The row designations remain the same as for the input combining network. As mentioned above, the hybrids of the output combining network 516 are of the O or output type described in conjunction with FIGS. 5a and 5b.

Figure 7C:
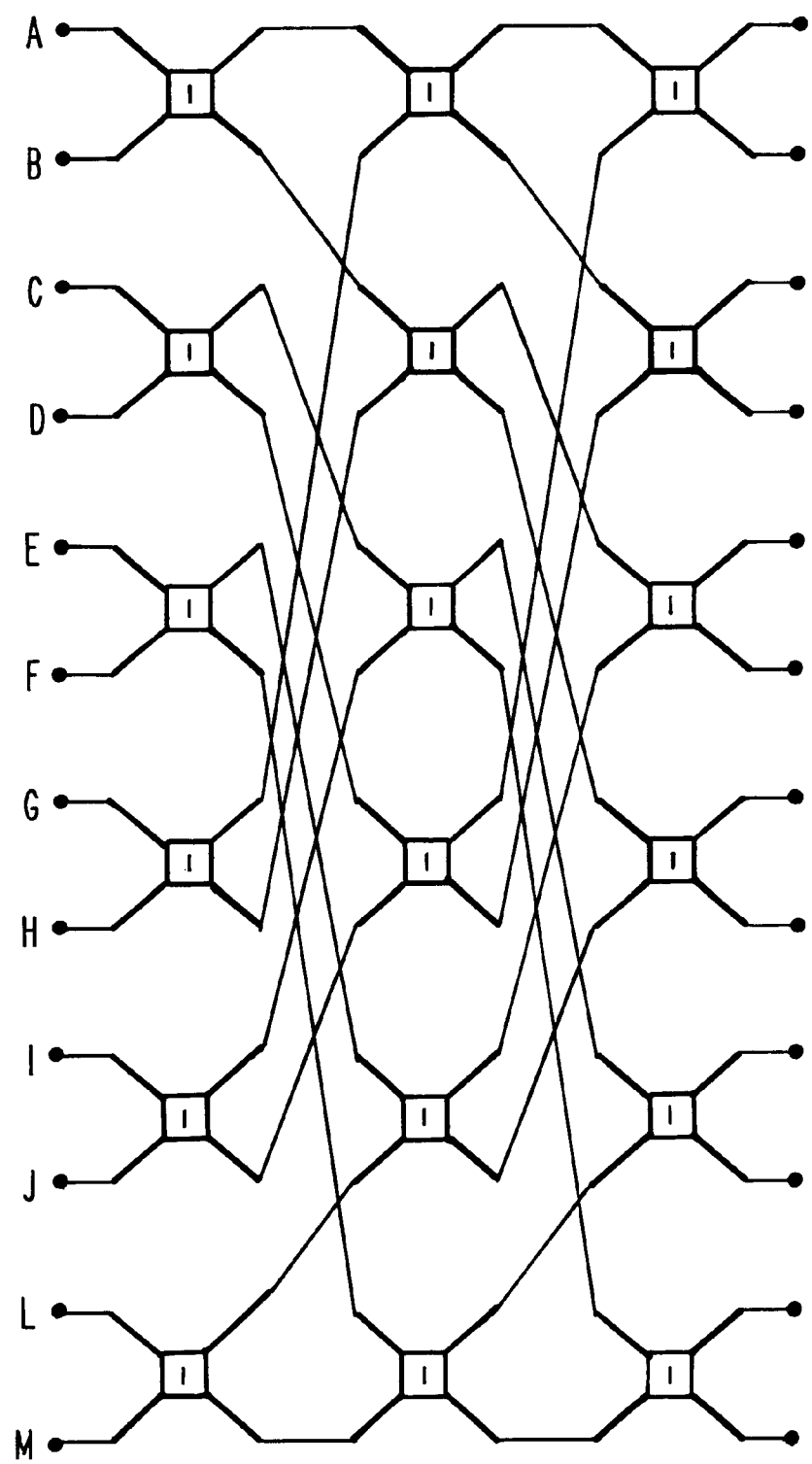

While the table of FIG. 7a applies only to the case of ten amplifiers in the paralleled amplifier arrangement, the equations can be used for any even number of amplifiers which do not necessarily equal a power of two. A table corresponding to that of FIG. 7a can be generated from the equations for any such number of amplifiers. For example, the table of FIG. 7b applies to a twelve-amplifier paralleling arrangement. The structure of FIG. 7c simply illustrates two mutually adjacent columns of hybrids to indicate the applicability of the tables of FIGS. 7a and 7b.

Figure 4:
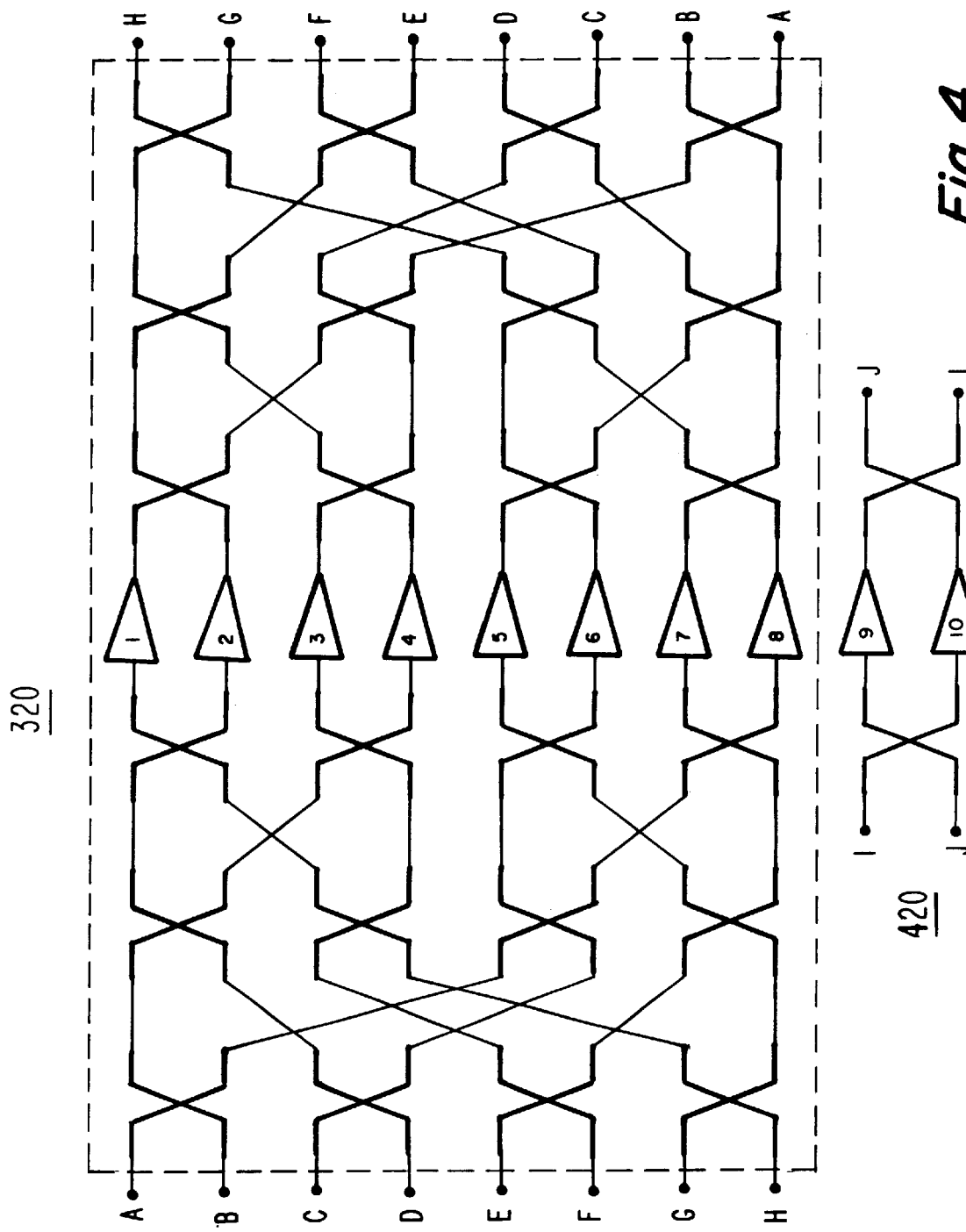
FIG. 4 is a simplified representation of a prior-art $2^N$ paralleled amplifier arrangement, which might be used for a ten-amplifier system.

The arrangement of FIG. 6a, b and c differs functionally from the prior-art arrangement of FIG. 4. It will be noted that in the arrangement of FIG. 4, the signals applied to input ports A, B, C, D, E, F, G, and H are divided into eight parts, which flow in equal amounts or with equal magnitudes through each of amplifiers 1, 2, 3, 4, 5, 6, 7, and 8, respectively, but the signals applied to input ports I and J are divided into two parts, to flow through amplifiers 9 and 10. Thus, some of the signals (those applied to ports A through H) each flow (in parallel) through eight amplifiers, while other signals (those applied to ports I and J) flow through only two amplifiers. By contrast, in the arrangement of FIG. 6b, the signals applied to any one of input ports A through J are divided eight times, and flow in equal amplitudes through eight of the ten amplifiers. No signal applied to an input port of the arrangement of FIG. 6b flows through less than eight amplifiers. This provides improved redundancy for at least some of the signals above that of the prior art, in addition to an improvement in EIRP flexibility to 100%.

Figure 8:
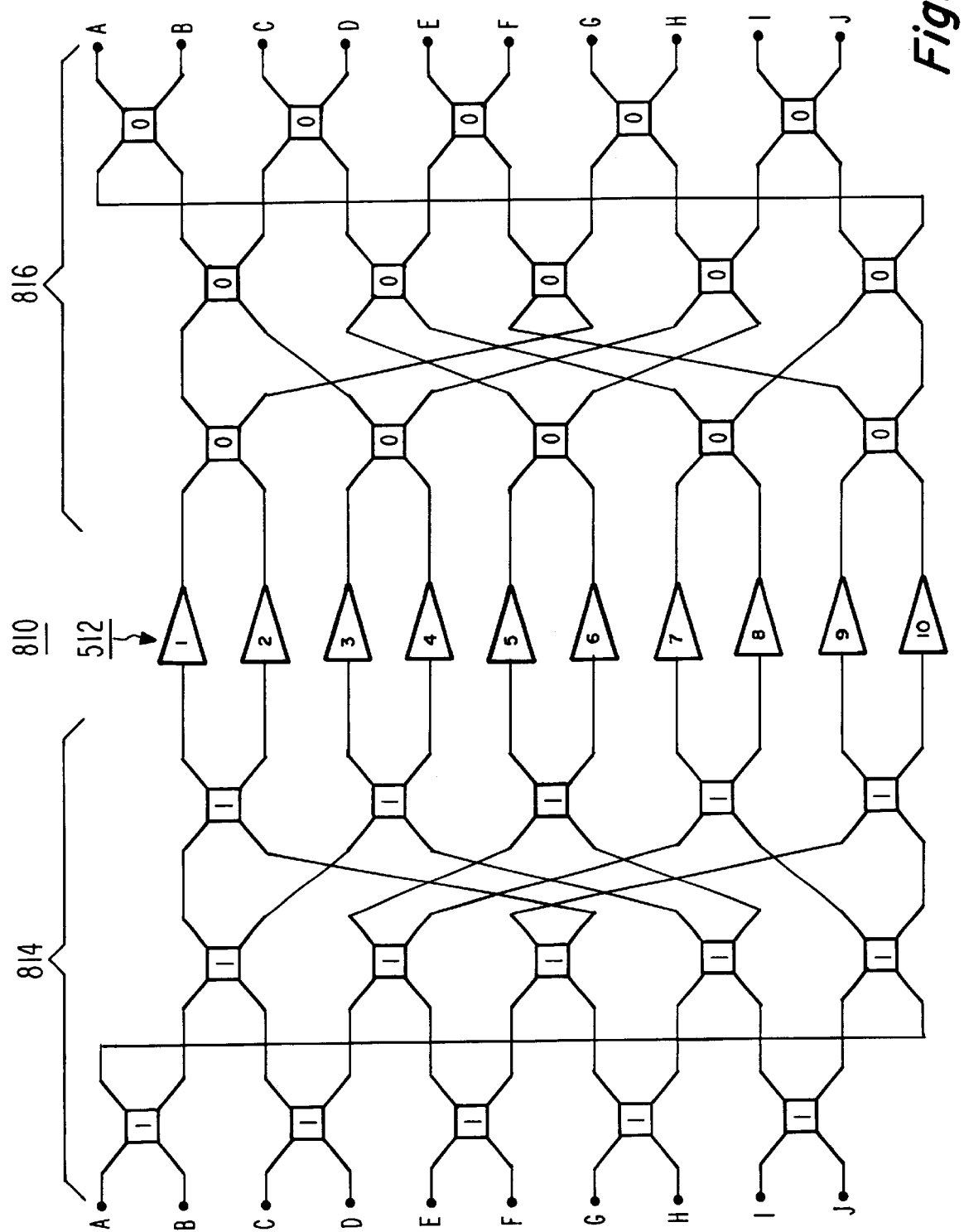
FIG. 8 is a simplified representation of another embodiment of a paralleled amplifier according to an aspect of the invention, in which the connections between the first and second columns of the hybrids are simplified.

The arrangement of FIGS. 6a, 6b, and 6c is not the only possible arrangement pursuant to the invention. FIG. 8 is a simplified diagram of another embodiment of the invention including a paralleled amplifier arrangement 810 using a set 512 of ten amplifiers paralleled by the use of an input hybrid arrangement 814 and an output hybrid arrangement 816. The input hybrid arrangement 814 differs from input hybrid arrangement 514 described in conjunction with FIG. 6, and the output hybrid arrangement 816 is the mirror image of input hybrid arrangement 814, and consequently also differs from output hybrid arrangement 516 of FIG. 6. In the arrangement of FIG. 8, simplified connections are provided between the first and second columns. The equations defining the connections of the input and output hybrid arrangements 814 and 816 of FIG. 8 are $$I_2[i,1]=O_1[i,2] \text{ for } i=1, \ldots, M/2 \tag{18}$$

$$I_2[i,2]=O_1[i+1,1] \text{ for } i=1,2, \ldots, M/2-1 \tag{19}$$

$$I_2[M/2,2]=O_1[1,1] \tag{20}$$

Figure 9:
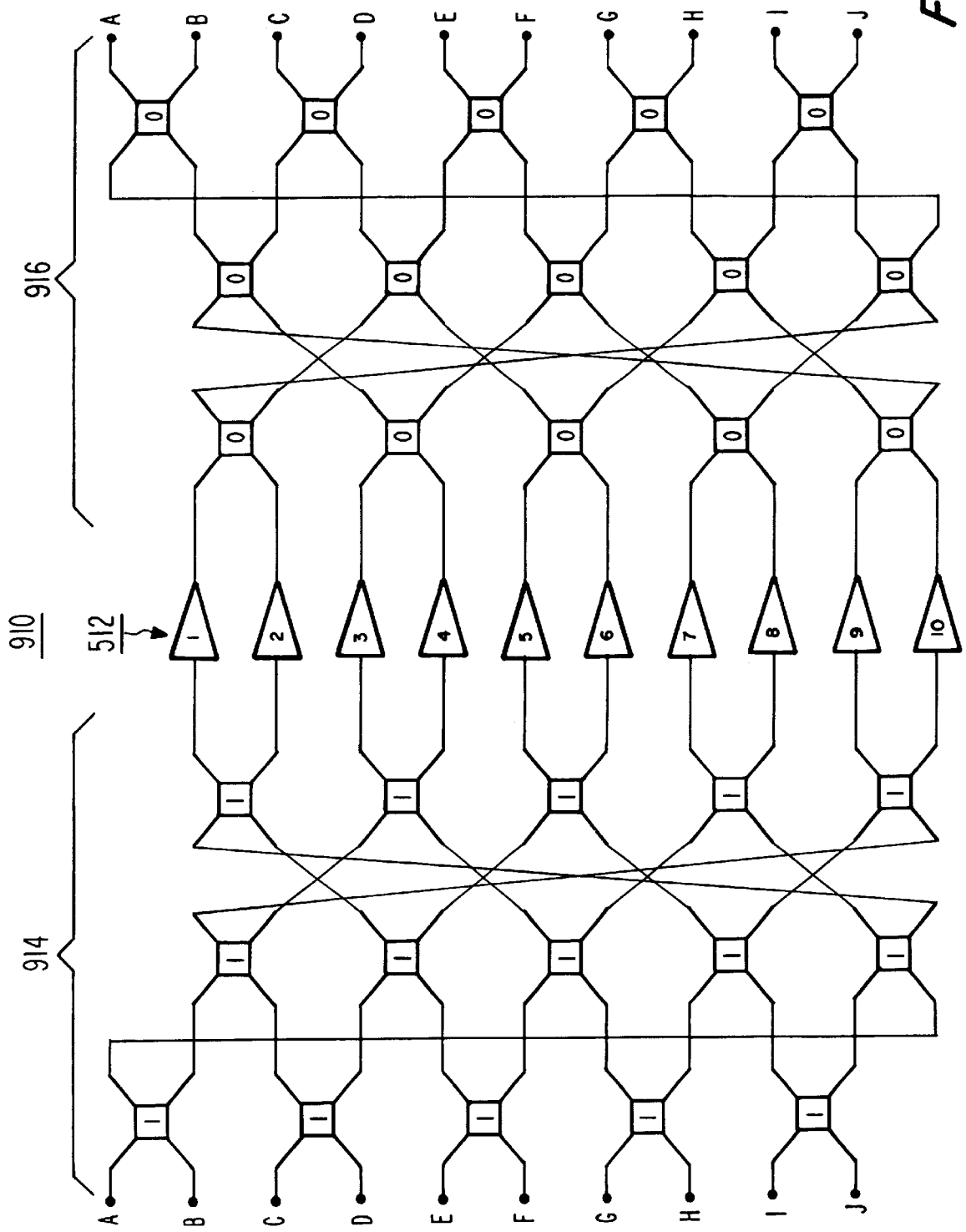
FIG. 9 is a simplified representation of another embodiment of a paralleled amplifier according to an aspect of the invention, in which the connections between the second and third columns of the hybrids are simplified.

Simplified connections may also be used between the second and third columns, as illustrated in FIG. 9. FIG. 9 is a simplified diagram of another embodiment of the invention including a paralleled amplifier arrangement m10 using a set 512 of ten amplifiers paralleled by the use of an input hybrid arrangement 914 and an output hybrid arrangement 916. The input hybrid arrangement 914 differs from input hybrid arrangement 514 described in conjunction with FIG. 6, and the output hybrid arrangement 916 is the mirror image of input hybrid arrangement 914, and consequently also differs from output hybrid arrangement 516 of FIG. 6. The equations defining the connections of the input and output hybrid arrangements 914 and 916 of FIG. 9 are $$I_3[i,1]=O_2[i-1,2] \text{ for } i=2,3, \ldots, M/2 \tag{21}$$

$$I_3[1,1]=O_2[M/2,2] \tag{22}$$

$$I_3[i,2]=O_{2\ [i+1,2]} \text{ for } i=1,2, \ldots, M/2-1 \tag{23}$$

$$I_3[M/2,2]=O_2[1,1] \tag{24}$$

The invention solves the problems of (a) how to connect the M' columns so that maximum division of the signal is obtained when the signals arrive at the set of individual amplifiers, (b) how to assure that all M individual amplifiers are equally used, so that the full RF power is realized when all M signals are present, even if M is not a power of 2, and (c) how to assure that the signals "add up" correctly (add in proper phase and amplitude) at the output of the paralleled amplifier arrangement.

Other embodiments of the invention will be apparent to those skilled in the art. For example, while the individual amplifiers are described as having single input and output ports, an amplifier having plural input and/or output ports may be used, so long as only a single input and output port are coupled into a path of the paralleled amplifier arrangement. Control input ports of the amplifiers, such as might be used for gain control or other purposes, of course, have not meaning in the context of the invention, and are not considered. While the specific illustrated examples are of ten-amplifier arrays, any even number of amplifiers may be used.

Thus, a paralleled amplifier arrangement (510, 810, 910), according to an aspect of the invention, includes a set (512) of amplifiers, which includes a plurality of individual amplifiers (1, 2, 3, 4, 5, 6, 7, 8, 9, 10). Each of the amplifiers of the set (512) includes an input port and an output port. The number of the amplifiers in the set of amplifiers associated with the paralleled amplifier arrangement (510), according to the invention, is an even number (10 in FIGS. 6a, 6b, 6c, 8, and 9) which is not an integer power of two. The paralleled amplifier arrangement (510, 810, 910) includes a plurality M of input ports (A through J), equal in number to the number of input ports associated with the set (512) of amplifiers. The paralleled amplifier arrangement (510, 810, 910) also includes a plurality of output ports (A' through J'), equal in number to the plurality of output ports of the set (512) of amplifiers. The paralleled amplifier arrangement (510, 810, 910) includes an input combining arrangement (514, 814, 914) including a number $\{(M/2) \text{int}(\log_2 M)\}$ of input hybrids ($514_{cr}$, where c=column and r=row), connected in such a manner that a signal applied to any one of the input ports (A through J) of the paralleled amplifier arrangement (510, 810, 910) is divided and flows through the same number of amplifiers as a signal applied to any other input port. In this context, an "input" hybrid is similar to a conventional or "output" hybrid, but has reversed input ports. The paralleled amplifier arrangement (510, 810, 910) further includes an output combining arrangement (516, 816, 916) coupled to the output ports of the set (512) of a plurality of amplifiers, and to the output ports (A' through J') of the paralleled amplifier arrangement (510, 810, 910). The output combining arrangement (516, 816, 916) includes a plurality of output hybrids (O), equal in number to the number of input (I) hybrids in the input combining arrangement (514, 814, 914), connected in a mirror-image manner relative to the connections of the input hybrids. In other words, the connections of the output hybrid arrangement (516, 816, 916), when "folded" along a line (8) associated with the array of the set (512) of amplifiers, is congruent with the connections of the input hybrid arrangement (514, 814, 914).

What is claimed is:

1. A paralleled amplifier arrangement comprising:

a plurality of M of amplifiers, each including an input port and an output port, said plurality being an even number which is not an integer power of two;

a plurality of input ports, said plurality of input ports being equal in number to said plurality of amplifiers;

a plurality of output ports, said plurality of output ports being equal in number to said plurality of input ports;

an input combining arrangement including a number $\{(M/2) \text{int}(\log_2 M)\}$ of input hybrids, connected in such a manner that a signal applied to any one of said input ports of said paralleled amplifier arrangement traverses an equal number of said number M of amplifiers; and an output combining arrangement coupled to said output ports of said plurality of amplifiers, and to said output ports of said paralleled amplifier arrangement, said output combining arrangement including said number of output hybrids, connected in a mirror-image manner relative to said connections of said input hybrids.

2. A method for amplifying signals in a plurality M of amplifiers, where M is a number other than an integer power of two, said method comprising the steps of:

dividing each of said signals to be amplified into a number P of equal-amplitude versions, where P is an integer power of two which is smaller than M, summing together said equal-amplitude versions, and applying the resulting summed-together signals to the input ports of said M amplifiers, in a manner which results in each of said signals to be amplified traversing P of said M amplifiers;

amplifying said P signals traversing each of said M amplifiers; and combining the outputs of said M amplifiers.

3. A method according to claim 2, wherein said step of dividing, summing, and applying are performed by a first array of input hybrids, and said step of combining the outputs is performed by an array of output hybrids in which the connections are a mirror image of those of said first array of hybrids.

4. A method according to claim 3, wherein the number M of amplifiers is ten, said number P is eight, and said first array comprises fifteen input hybrids arranged in three columns, each of five hybrids.

5. A method according to claim 3, wherein the number M of amplifiers is twelve, said number P is eight, and said first array comprises eighteen input hybrids arranged in three columns, each of six hybrids.

* * * * *